US012601974B2

(12) United States Patent
Weidman et al.

(10) Patent No.: US 12,601,974 B2
(45) Date of Patent: Apr. 14, 2026

(54) BAKE STRATEGIES TO ENHANCE LITHOGRAPHIC PERFORMANCE OF METAL-CONTAINING RESIST

(71) Applicant: Lam Research Corporation, Fremont, CA (US)

(72) Inventors: Timothy William Weidman, Sunnyvale, CA (US); Chenghao Wu, Berkeley, CA (US); Katie Lynn Nardi, San Jose, CA (US); Boris Volosskiy, San Jose, CA (US); Kevin Li Gu, Mountain View, CA (US)

(73) Assignee: Lam Research Corporation, Fremont, CA (US)

( * ) Notice: Subject to any disclaimer, the term of this patent is extended or adjusted under 35 U.S.C. 154(b) by 657 days.

(21) Appl. No.: 17/596,858

(22) PCT Filed: Jun. 24, 2020

(86) PCT No.: PCT/US2020/070171
§ 371 (c)(1),
(2) Date: Dec. 20, 2021

(87) PCT Pub. No.: WO2020/264556
PCT Pub. Date: Dec. 30, 2020

(65) Prior Publication Data
US 2022/0308454 A1 Sep. 29, 2022

Related U.S. Application Data

(60) Provisional application No. 62/868,708, filed on Jun. 28, 2019.

(51) Int. Cl.
| | |
|---|---|
| *G03F 7/16* | (2006.01) |
| *G03F 7/004* | (2006.01) |
| *G03F 7/20* | (2006.01) |

(52) U.S. Cl.
CPC ............ *G03F 7/168* (2013.01); *G03F 7/0043* (2013.01); *G03F 7/2004* (2013.01)

(58) Field of Classification Search
CPC ....... G03F 7/168; G03F 7/0043; G03F 7/0044
See application file for complete search history.

(56) References Cited

U.S. PATENT DOCUMENTS

| | | | |
|---|---|---|---|
| 3,513,010 A | 5/1970 | Notley et al. |
| 3,529,963 A | 9/1970 | Marchese et al. |
| 3,576,755 A | 4/1971 | Patella et al. |
| 3,720,515 A | 3/1973 | Stanley |
| 4,241,165 A | 12/1980 | Hughes et al. |
| 4,314,022 A | 2/1982 | Fisch |
| 4,328,298 A | 5/1982 | Nester |
| 4,590,149 A | 5/1986 | Nakane et al. |
| 4,806,456 A | 2/1989 | Katoh |
| 4,814,243 A | 3/1989 | Ziger |
| 4,834,834 A | 5/1989 | Ehrlich et al. |
| 4,842,989 A | 6/1989 | Taniguchi et al. |
| 4,845,053 A | 7/1989 | Zajac |
| 5,077,085 A | 12/1991 | Schnur et al. |
| 5,322,765 A | 6/1994 | Clecak et al. |
| 5,534,312 A | 7/1996 | Hill et al. |
| 5,798,203 A | 8/1998 | Haraguchi et al. |
| 6,017,553 A | 1/2000 | Burrell et al. |
| 6,162,577 A | 12/2000 | Felter et al. |
| 6,183,934 B1 | 2/2001 | Kawamonzen |
| 6,245,650 B1 | 6/2001 | Watanabe |
| 6,261,938 B1 | 7/2001 | Beauvais et al. |
| 6,290,779 B1 | 9/2001 | Saleh et al. |
| 6,348,239 B1 | 2/2002 | Hill et al. |
| 6,566,276 B2 | 5/2003 | Maloney et al. |
| 6,573,030 B1 | 6/2003 | Fairbairn et al. |
| 6,607,867 B1 | 8/2003 | Kim et al. |
| 6,797,439 B1 | 9/2004 | Alpay |
| 6,841,341 B2 | 1/2005 | Fairbairn et al. |
| 7,223,526 B2 | 5/2007 | Fairbairn et al. |
| 7,232,742 B1 | 6/2007 | Maekawa |
| 7,335,462 B2 | 2/2008 | Fairbairn et al. |
| 8,465,903 B2 | 6/2013 | Weidman et al. |

(Continued)

FOREIGN PATENT DOCUMENTS

| | | |
|---|---|---|
| CN | 1495861 A | 5/2004 |
| CN | 1841201 A | 10/2006 |

(Continued)

OTHER PUBLICATIONS

CN Office Action dated Jan. 22, 2024 in CN Application No. 202080047683.X, with English Translation.
CN Office Action dated Jul. 26, 2024 in CN Application No. 202080047683.X with English translation.
EP Extended European Search Report dated Jun. 26, 2023, in Application No. 20831343.7.
International Search Report and Written Opinion dated Jul. 13, 2021, in PCT Application No. PCT/US2021/023901.
International Preliminary Report on Patentability and Written Opinion dated Feb. 8, 2024 in PCT Application No. PCT/US2022/037393.
International Preliminary Report on Patentability and Written Opinion dated Feb. 8, 2024 in PCT Application No. PCT/US2022/037733.

(Continued)

*Primary Examiner* — Daborah Chacko-Davis
(74) *Attorney, Agent, or Firm* — Weaver Austin Villeneuve & Sampson LLP

(57) ABSTRACT
Various embodiments herein relate to methods, apparatus, and systems for baking metal-containing on a semiconductor substrate in the presence of a reactive gas species. For example, the method may include receiving the substrate in a process chamber, the substrate having a photoresist layer thereon, where the photoresist layer includes a metal-containing photoresist material; flowing a reactive gas species from a gas source, through a gas delivery line, into the process chamber, and exposing the substrate to the reactive gas species in the process chamber; and baking the photoresist layer while the substrate is exposed to the reactive gas species.

19 Claims, 2 Drawing Sheets

(56)            References Cited

U.S. PATENT DOCUMENTS

| | | | |
|---|---|---|---|
| 8,664,124 B2 | 3/2014 | Graff | |
| 8,664,513 B2 | 3/2014 | Pfenninger et al. | |
| 9,023,731 B2 | 5/2015 | Ji et al. | |
| 9,310,684 B2 | 4/2016 | Meyers et al. | |
| 9,551,924 B2 | 1/2017 | Burkhardt et al. | |
| 9,778,561 B2 | 10/2017 | Marks et al. | |
| 9,823,564 B2 | 11/2017 | Stowers et al. | |
| 9,996,004 B2 | 6/2018 | Smith et al. | |
| 10,025,179 B2 | 7/2018 | Meyers et al. | |
| 10,228,618 B2 | 3/2019 | Meyers et al. | |
| 10,416,554 B2 | 9/2019 | Meyers et al. | |
| 10,514,598 B2 | 12/2019 | Marks et al. | |
| 10,580,585 B2 | 3/2020 | Snaith et al. | |
| 10,627,719 B2 | 4/2020 | Waller et al. | |
| 10,642,153 B2 | 5/2020 | Meyers et al. | |
| 10,649,328 B2 | 5/2020 | Stowers et al. | |
| 10,732,505 B1 | 8/2020 | Meyers et al. | |
| 10,775,696 B2 | 9/2020 | Meyers et al. | |
| 10,782,610 B2 | 9/2020 | Stowers et al. | |
| 10,787,466 B2 | 9/2020 | Edson et al. | |
| 10,831,096 B2 | 11/2020 | Marks et al. | |
| 11,988,965 B2 | 5/2024 | Tan et al. | |
| 12,105,422 B2 * | 10/2024 | Tan | G03F 7/36 |
| 12,436,464 B2 | 10/2025 | Weidman et al. | |
| 2002/0017243 A1 | 2/2002 | Pyo | |
| 2002/0180372 A1 | 12/2002 | Yamazaki | |
| 2003/0008246 A1 | 1/2003 | Cheng et al. | |
| 2003/0049571 A1 | 3/2003 | Hallock et al. | |
| 2003/0183244 A1 | 10/2003 | Rossman | |
| 2004/0113087 A1 | 6/2004 | Ikeda et al. | |
| 2004/0121264 A1 | 6/2004 | Liegl et al. | |
| 2004/0175631 A1 | 9/2004 | Crocker et al. | |
| 2004/0191423 A1 | 9/2004 | Ruan et al. | |
| 2004/0209201 A1 | 10/2004 | Nakano et al. | |
| 2004/0213563 A1 | 10/2004 | Irie | |
| 2005/0167617 A1 | 8/2005 | Derra et al. | |
| 2005/0208389 A1 | 9/2005 | Ishibashi et al. | |
| 2005/0250052 A1 | 11/2005 | Nguyen | |
| 2005/0253077 A1 | 11/2005 | Ikeda et al. | |
| 2006/0001064 A1 | 1/2006 | Hill et al. | |
| 2006/0068173 A1 | 3/2006 | Kajiyama et al. | |
| 2006/0147818 A1 | 7/2006 | Lee | |
| 2006/0151462 A1 | 7/2006 | Lee et al. | |
| 2006/0166537 A1 | 7/2006 | Thompson et al. | |
| 2006/0175558 A1 | 8/2006 | Bakker et al. | |
| 2007/0017386 A1 | 1/2007 | Kamei | |
| 2007/0037357 A1 | 2/2007 | Culp | |
| 2007/0074541 A1 | 4/2007 | Badding et al. | |
| 2007/0181816 A1 | 8/2007 | Ikeda et al. | |
| 2008/0004203 A1 | 1/2008 | Scheuing et al. | |
| 2008/0157011 A1 | 7/2008 | Nagai et al. | |
| 2008/0236620 A1 | 10/2008 | Shih et al. | |
| 2009/0041650 A1 | 2/2009 | Watanabe et al. | |
| 2009/0134119 A1 | 5/2009 | Matsumaru et al. | |
| 2009/0208880 A1 | 8/2009 | Nemani et al. | |
| 2009/0239155 A1 | 9/2009 | Levinson et al. | |
| 2009/0305174 A1 | 12/2009 | Shiobara et al. | |
| 2009/0325387 A1 | 12/2009 | Chen et al. | |
| 2010/0051446 A1 | 3/2010 | Wang et al. | |
| 2010/0075508 A1 | 3/2010 | Seino et al. | |
| 2010/0131093 A1 | 5/2010 | Yokoyama et al. | |
| 2010/0197135 A1 | 8/2010 | Ishizaka | |
| 2010/0266969 A1 | 10/2010 | Shiraishi et al. | |
| 2010/0304027 A1 | 12/2010 | Lee et al. | |
| 2011/0028000 A1 | 2/2011 | Rogojina et al. | |
| 2011/0104595 A1 | 5/2011 | Hayashi et al. | |
| 2011/0174606 A1 | 7/2011 | Funk et al. | |
| 2011/0184139 A1 * | 7/2011 | Malik | C23C 18/06 |
| | | | 430/269 |
| 2011/0195362 A1 | 8/2011 | Watanabe et al. | |
| 2011/0198756 A1 | 8/2011 | Thenappan et al. | |
| 2011/0209725 A1 | 9/2011 | Kim et al. | |
| 2011/0244402 A1 | 10/2011 | Carcasi et al. | |
| 2011/0308942 A1 | 12/2011 | Liu et al. | |
| 2012/0088193 A1 | 4/2012 | Weidman et al. | |
| 2012/0088369 A1 | 4/2012 | Weidman et al. | |
| 2012/0202357 A1 | 8/2012 | Sato et al. | |
| 2012/0208125 A1 | 8/2012 | Hatakeyama | |
| 2012/0223418 A1 | 9/2012 | Stowers et al. | |
| 2012/0322011 A1 | 12/2012 | Wu et al. | |
| 2013/0129995 A1 | 5/2013 | Ouattara et al. | |
| 2013/0157177 A1 | 6/2013 | Yu et al. | |
| 2013/0164691 A1 | 6/2013 | Shiobara | |
| 2013/0183609 A1 | 7/2013 | Seon et al. | |
| 2013/0224652 A1 | 8/2013 | Bass et al. | |
| 2014/0014745 A1 | 1/2014 | Burrows et al. | |
| 2014/0170563 A1 | 6/2014 | Hatakeyama | |
| 2014/0170853 A1 | 6/2014 | Shamma et al. | |
| 2014/0206200 A1 | 7/2014 | Nelson | |
| 2014/0209015 A1 | 7/2014 | Yamada et al. | |
| 2014/0220495 A1 * | 8/2014 | Bozano | G03F 7/0392 |
| | | | 430/325 |
| 2014/0239462 A1 | 8/2014 | Shamma et al. | |
| 2014/0263172 A1 | 9/2014 | Xie et al. | |
| 2014/0268082 A1 | 9/2014 | Michaelson et al. | |
| 2014/0272726 A1 | 9/2014 | Chang | |
| 2015/0056542 A1 | 2/2015 | Meyers et al. | |
| 2015/0079393 A1 | 3/2015 | Freedman et al. | |
| 2015/0125679 A1 | 5/2015 | Ishikawa | |
| 2015/0152551 A1 | 6/2015 | Yamaguchi et al. | |
| 2015/0221519 A1 | 8/2015 | Marks et al. | |
| 2015/0303064 A1 | 10/2015 | Singer et al. | |
| 2016/0011505 A1 | 1/2016 | Stowers et al. | |
| 2016/0011516 A1 | 1/2016 | Devilliers | |
| 2016/0035631 A1 | 2/2016 | Lee et al. | |
| 2016/0086864 A1 | 3/2016 | Fischer et al. | |
| 2016/0116839 A1 | 4/2016 | Meyers et al. | |
| 2016/0216606 A1 | 7/2016 | Meyers et al. | |
| 2016/0284559 A1 | 9/2016 | Kikuchi et al. | |
| 2016/0357103 A1 | 12/2016 | Nagahara et al. | |
| 2016/0357107 A1 | 12/2016 | Buchberger, Jr. et al. | |
| 2017/0066225 A1 | 3/2017 | Chen et al. | |
| 2017/0092495 A1 | 3/2017 | Chen et al. | |
| 2017/0097569 A1 | 4/2017 | Yang et al. | |
| 2017/0097570 A1 | 4/2017 | Tagawa | |
| 2017/0102612 A1 | 4/2017 | Meyers et al. | |
| 2017/0146909 A1 | 5/2017 | Smith et al. | |
| 2017/0154766 A1 | 6/2017 | Ogihara et al. | |
| 2017/0168398 A1 | 6/2017 | Zi et al. | |
| 2017/0176858 A1 | 6/2017 | Hirano | |
| 2017/0261850 A1 | 9/2017 | Stowers et al. | |
| 2018/0004083 A1 | 1/2018 | Marks et al. | |
| 2018/0012759 A1 | 1/2018 | Smith et al. | |
| 2018/0039172 A1 | 2/2018 | Stowers et al. | |
| 2018/0039182 A1 | 2/2018 | Zi et al. | |
| 2018/0046086 A1 | 2/2018 | Waller et al. | |
| 2018/0096840 A1 | 4/2018 | Jeong et al. | |
| 2018/0122648 A1 | 5/2018 | Kim et al. | |
| 2018/0149976 A1 | 5/2018 | Liu et al. | |
| 2018/0164689 A1 | 6/2018 | Sano et al. | |
| 2018/0166278 A1 | 6/2018 | Belyansky et al. | |
| 2018/0173096 A1 | 6/2018 | Zi et al. | |
| 2018/0224744 A1 | 8/2018 | Bae et al. | |
| 2018/0233362 A1 | 8/2018 | Glodde et al. | |
| 2018/0307137 A1 | 10/2018 | Meyers et al. | |
| 2018/0308687 A1 | 10/2018 | Smith et al. | |
| 2018/0314167 A1 | 11/2018 | Chang et al. | |
| 2018/0356731 A1 | 12/2018 | Tagawa | |
| 2019/0056914 A1 | 2/2019 | Ma et al. | |
| 2019/0094685 A1 | 3/2019 | Marks et al. | |
| 2019/0129307 A1 | 5/2019 | Kwon et al. | |
| 2019/0137870 A1 | 5/2019 | Meyers et al. | |
| 2019/0146337 A1 | 5/2019 | Zi et al. | |
| 2019/0153001 A1 | 5/2019 | Cardineau et al. | |
| 2019/0163056 A1 | 5/2019 | Maes et al. | |
| 2019/0163065 A1 | 5/2019 | Hatakeyama et al. | |
| 2019/0187556 A1 | 6/2019 | Park et al. | |
| 2019/0258160 A1 | 8/2019 | Satoh et al. | |
| 2019/0308998 A1 | 10/2019 | Cardineau et al. | |
| 2019/0315781 A1 | 10/2019 | Edson et al. | |
| 2019/0315782 A1 | 10/2019 | Edson et al. | |
| 2019/0348292 A1 | 11/2019 | Dutta et al. | |
| 2019/0369489 A1 | 12/2019 | Meyers et al. | |
| 2019/0391486 A1 | 12/2019 | Jiang et al. | |

(56) References Cited

U.S. PATENT DOCUMENTS

| | | |
|---|---|---|
| 2020/0041901 A1 | 2/2020 | Namgung et al. |
| 2020/0050109 A1 | 2/2020 | Ho et al. |
| 2020/0064733 A1 | 2/2020 | Meyers et al. |
| 2020/0066536 A1 | 2/2020 | Yaegashi |
| 2020/0089104 A1 | 3/2020 | Marks et al. |
| 2020/0096870 A1 | 3/2020 | Ma et al. |
| 2020/0124970 A1 | 4/2020 | Kocsis et al. |
| 2020/0174374 A1 | 6/2020 | Liao et al. |
| 2020/0209756 A1 | 7/2020 | Waller et al. |
| 2020/0239498 A1 | 7/2020 | Clark et al. |
| 2020/0241413 A1 | 7/2020 | Clark et al. |
| 2020/0257196 A1 | 8/2020 | Meyers et al. |
| 2020/0292937 A1 | 9/2020 | Stowers et al. |
| 2020/0326627 A1 | 10/2020 | Jiang et al. |
| 2021/0013034 A1 | 1/2021 | Wu et al. |
| 2021/0013037 A1 | 1/2021 | Sun et al. |
| 2021/0041784 A1 | 2/2021 | Chen et al. |
| 2021/0111025 A1 | 4/2021 | Zyulkov et al. |
| 2021/0216016 A1 | 7/2021 | Tagawa |
| 2021/0271170 A1 | 9/2021 | Telecky et al. |
| 2021/0302833 A1 | 9/2021 | Weng et al. |
| 2021/0349390 A1 | 11/2021 | De Schepper et al. |
| 2022/0037152 A1 | 2/2022 | Raley et al. |
| 2022/0299877 A1 | 9/2022 | Weidman et al. |
| 2023/0031955 A1 | 2/2023 | Yu et al. |
| 2023/0152705 A1 | 5/2023 | Grzeskowiak et al. |
| 2023/0185196 A1 | 6/2023 | Weidman et al. |
| 2023/0230811 A1 | 7/2023 | Yu et al. |
| 2023/0266670 A1 | 8/2023 | Hansen et al. |
| 2023/0341781 A1 | 10/2023 | Han et al. |
| 2024/0036474 A1 | 2/2024 | Peter et al. |
| 2024/0192590 A1 | 6/2024 | Kanakasabapathy et al. |
| 2024/0329539 A1 | 10/2024 | Tan et al. |
| 2025/0053084 A1 | 2/2025 | Hansen et al. |
| 2025/0093781 A1 | 3/2025 | Peter et al. |
| 2025/0244678 A1 | 7/2025 | Lee et al. |
| 2025/0271766 A1 | 8/2025 | Hansen et al. |

FOREIGN PATENT DOCUMENTS

| | | |
|---|---|---|
| CN | 101828266 A | 9/2010 |
| CN | 102610516 A | 7/2012 |
| CN | 104637792 A | 5/2015 |
| CN | 105489635 A | 4/2016 |
| CN | 107153326 A | 9/2017 |
| CN | 110609441 A | 12/2019 |
| CN | 116009357 A | 4/2023 |
| EP | 1253629 A2 | 10/2002 |
| EP | 1123423 B1 | 8/2007 |
| EP | 3596155 B1 | 8/2022 |
| JP | S52144972 A | 12/1977 |
| JP | S5883847 A | 5/1983 |
| JP | H03228327 A | 10/1991 |
| JP | H0572747 A | 3/1993 |
| JP | H0745580 A | 2/1995 |
| JP | H0757995 A | 3/1995 |
| JP | H07106224 A | 4/1995 |
| JP | H07244386 A | 9/1995 |
| JP | H0831781 A | 2/1996 |
| JP | H08330288 A | 12/1996 |
| JP | H08339950 A | 12/1996 |
| JP | H10172957 A | 6/1998 |
| JP | H10301298 A | 11/1998 |
| JP | 2000223461 A | 8/2000 |
| JP | 2001250813 A | 9/2001 |
| JP | 2003213001 A | 7/2003 |
| JP | 2003532303 A | 10/2003 |
| JP | 2004006798 A | 1/2004 |
| JP | 2005504146 A | 2/2005 |
| JP | 2005123651 A | 5/2005 |
| JP | 2005317652 A | 11/2005 |
| JP | 2006253282 A | 9/2006 |
| JP | 2010074065 A | 4/2010 |
| JP | 2010245327 A | 10/2010 |
| JP | 2011511476 A | 4/2011 |
| JP | 2011099956 A | 5/2011 |
| JP | 2011520242 A | 7/2011 |
| JP | 2011529126 A | 12/2011 |
| JP | 2012185485 A | 9/2012 |
| JP | 2013135066 A | 7/2013 |
| JP | 2013542944 A | 11/2013 |
| JP | 2014621111 A | 8/2014 |
| JP | 2015513540 A | 5/2015 |
| JP | 2015201622 A | 11/2015 |
| JP | 2016530565 A | 9/2016 |
| JP | 2017116923 A | 6/2017 |
| JP | 2017532407 A | 11/2017 |
| JP | 2018502173 A | 1/2018 |
| JP | 2018098229 A | 6/2018 |
| JP | 2019500490 A | 1/2019 |
| JP | 2019506730 A | 3/2019 |
| JP | 2019095794 A | 6/2019 |
| JP | 2019532182 A | 11/2019 |
| JP | 2020129607 A | 8/2020 |
| JP | 2021005737 A | 1/2021 |
| JP | 2022502714 A | 1/2022 |
| KR | 100398312 B1 | 9/2003 |
| KR | 20090042059 A | 4/2009 |
| KR | 20120093781 A | 8/2012 |
| KR | 20130093038 A | 8/2013 |
| KR | 20140121826 A | 10/2014 |
| KR | 20150129781 A | 11/2015 |
| KR | 20160082969 A | 7/2016 |
| KR | 20180054917 A | 5/2018 |
| KR | 20190060678 A | 6/2019 |
| KR | 20200144580 A | 12/2020 |
| TW | 200947117 A | 11/2009 |
| TW | 201140230 A | 11/2011 |
| TW | 201224190 A | 6/2012 |
| TW | 201241555 A | 10/2012 |
| TW | 201327057 A | 7/2013 |
| TW | 201502696 A | 1/2015 |
| TW | 201539539 A | 10/2015 |
| TW | 201631377 A | 9/2016 |
| TW | 201729006 A | 8/2017 |
| TW | 201734667 A | 10/2017 |
| TW | 201826034 A | 7/2018 |
| TW | 201903886 A | 1/2019 |
| TW | 201907445 A | 2/2019 |
| TW | 201931011 A | 8/2019 |
| TW | 201937545 A | 9/2019 |
| TW | 202001993 A | 1/2020 |
| TW | 202006168 A | 2/2020 |
| TW | 202117468 A | 5/2021 |
| WO | WO-03029015 A2 | 4/2003 |
| WO | WO-2004095551 A1 | 11/2004 |
| WO | WO-2008139621 A1 | 11/2008 |
| WO | WO-2011081151 A1 | 7/2011 |
| WO | WO-2012088369 A2 | 6/2012 |
| WO | WO-2012048094 A3 | 7/2012 |
| WO | WO-2013119134 A1 | 8/2013 |
| WO | WO-2013128313 A1 | 9/2013 |
| WO | WO-2014152023 A1 | 9/2014 |
| WO | WO-2016144960 A1 | 9/2016 |
| WO | WO-2017002497 A1 | 1/2017 |
| WO | WO-2017066319 A2 | 4/2017 |
| WO | WO-2017198418 A1 | 11/2017 |
| WO | WO-2018004551 A1 | 1/2018 |
| WO | WO-2018061670 A1 | 4/2018 |
| WO | WO-2019059074 A1 | 3/2019 |
| WO | WO-2019125952 A1 | 6/2019 |
| WO | WO-2019217749 A1 | 11/2019 |
| WO | WO-2020102085 A1 | 5/2020 |
| WO | WO-2020132281 A1 | 6/2020 |
| WO | WO-2020190941 A1 | 9/2020 |
| WO | WO-2020263750 A1 | 12/2020 |
| WO | WO-2020264158 A1 | 12/2020 |
| WO | WO-2020264556 A1 | 12/2020 |
| WO | WO-2020264571 A1 | 12/2020 |
| WO | WO-2021202681 A1 | 10/2021 |
| WO | WO-2021262529 A1 | 12/2021 |

(56)  References Cited

FOREIGN PATENT DOCUMENTS

WO      WO-2022006349 A1      1/2022
WO      WO-2022016128 A1      1/2022

OTHER PUBLICATIONS

International Preliminary Report on Patentability and Written Opinion dated Jun. 27, 2024 in PCT Application No. PCT/US2022/081376.
International Preliminary Report on Patentability dated Jan. 26, 2023 in PCT Application No. PCT/US2021/042106.
International Preliminary Report on Patentability dated Oct. 12, 2023, in PCT Application No. PCT/US2022/022790.
International Preliminary Report on Patentability dated Oct. 13, 2022, in PCT Application No. PCT/US2021/023901.
International Search Report and Written Opinion dated Apr. 17, 2023 in PCT Application No. PCT/US2022/081376.
International Search Report and Written Opinion dated Aug. 17, 2023, in Application No. PCT/US2023/019871.
International Search Report and Written Opinion dated Jul. 22, 2022 in Application No. PCT/US2022/022790.
International Search Report and Written Opinion dated Nov. 4, 2021 in PCT Application No. PCT/US2021/042106.
International Search Report and Written Opinion dated Nov. 7, 2022 in PCT Application No. PCT/US2022/037393.
JP Office Action dated Aug. 6, 2024 in JP Application No. 2023-558732, with English Translation.
JP Office Action dated Dec. 26, 2023 in JP Application No. 20210576241, with English Translation.
JP Office Action dated Mar. 26, 2024 in JP Application No. 2023-558732 with English translation.
JP Office Action dated May 14, 2024 in JP Application No. 2021-576241 with English translation.
KR Notice of Allowances dated Jul. 8, 2024, in KR Application No. 10-2024-7006338 with English Translation.
SG Search Report and Written Opinion dated Jul. 3, 2024 in SG Application No. 11202114196U.
SG Search Report and Written Opinion dated May 14, 2024 in SG Application No. 11202251864Y.
TW Office Action dated Apr. 17, 2024 in TW Application No. 111112111 with English translation.
TW Office Action dated Aug. 6, 2024 in TW Application No. 110122525, with English Translation.
TW Office Action dated Aug. 8, 2024 in TW Application No. 111112111, with English Translation.
TW Office Action dated Jul. 2, 2024 in TW Application No. 109134940 with English translation.
TW Office Action dated Jul. 23, 2024 in TW Application No. 110111878, with English Translation.
TW Office Action dated Jun. 27, 2024 in TW Application No. 110103944, with English Translation.
TW Office Action dated Mar. 11, 2024 in TW Application No. 109121649, with English Translation.
U.S. Non-Final Office Action dated May 31, 2024 in U.S. Appl. No. 18/550,733.
U.S. Restriction requirement dated Feb. 14, 2024, in U.S. Appl. No. 18/550,733.
Chinese First Office Action dated May 24, 2017 issued in Application No. CN 201510053668.7.
Chinese Second Office Action dated Feb. 28, 2018 issued in Application No. CN 201510053668.7.
Coons et al., (2010) "Comparison of EUV spectral and ion emission features from laser-produced Sn and Li plasmas," Extreme Ultraviolet (EUV) Lithography, Proc. of SPIE, 7636:763636-1 to 763636-7.
Gerritsen et al., (Apr. 1, 1986) "Laser-generated plasma as soft x-ray source," J. Appl. Phys., 59(7):2337-2344.
Hamley, I.W., "Nanostructure fabrication using block copolymers", Nanotechnology. Sep. 2003. 17;14(10):R39-R54.
Hench, L.L. and West, J.K., "The sol-gel process," Chemical reviews, Jan. 1, 1990; 90(1) pp. 33-72.
International Preliminary Report on Patentability dated Jul. 1, 2021 issued in Application No. PCT/US2019/067540.
International Preliminary Report on Patentability dated May 27, 2021 issued in Application No. PCT/US2019/060742.
International Search Report and Written Opinion dated May 17, 2021 issued in Application No. PCT/US2021/015656.
International Search Report and Written Opinion dated May 12, 2021 issued in Application No. PCT/US2021/012953.
International Search Report and Written Opinion dated Apr. 10, 2020 issued in Application No. PCT/US2019/060742.
International Search Report and Written Opinion dated Apr. 24, 2020 issued in Application No. PCT/US2019/067540.
International Search Report and Written Opinion dated Aug. 22, 2019 issued in Application No. PCT/US2019/031618.
International Search Report and Written Opinion dated Jan. 27, 2021 issued in Application No. PCT/US2020/054730.
International Search Report and Written Opinion dated Mar. 23, 2021 issued in Application No. PCT/US2020/053856.
International Search Report and Written Opinion dated Oct. 16, 2020 issued in Application No. PCT/US2020/039615.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 16, 2020 issued in Application No. PCT/US2020/070187.
International Search Report and Written Opinion dated Oct. 8, 2020 issued in Application No. PCT/US2020/038968.
Japanese Decision to Grant dated Feb. 12, 2019 issued in Application No. JP 2015-016254.
Japanese Decision to Grant dated May 3, 2021 issued in Application No. JP 2016-220096.
Japanese First Office Action dated Oct. 30, 2018 issued in Application No. JP 2015-016254.
Japanese First Office Action dated Sep. 15, 2020 issued in Application No. JP 2016-220096.
Korean Decision for Grant dated Sep. 2, 2021 issued in Application No. KR 10-2015-0015184.
Korean First Office Action dated Dec. 22, 2020 issued in Application No. KR 10-2015-0015184.
Korean Second Office Action dated Jul. 27, 2021 issued in Application No. KR 10-2015-0015184.
Kwon, J., et al., "Substrate Selectivity of (tBu-Allyl)Co(CO)3 during Thermal Atomic Layer Deposition of Cobalt" Chemistry of Materials, Mar. 27, 2012; 24(6): pp. 1025-1030.
Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.
Lu, Y., et al., "Continuous formation of supported cubic and hexagonal mesoporous films by sol-gel dip-coating" Nature, Sep. 1997, 389(6649), pp. 364-368.
Mackus, A.J., et al. "The use of atomic layer deposition in advanced nanopatterning", Nanoscale. Jul. 25, 2014; 6(19):10941-60.
McGinniss, Vincent D., (1978) "Light Sources," Edited by: Pappas, S. Peter, UV Curing: Science and Technology; technology marketing corporation, 642 Westover Rd., Stamford, CT, USA; pp. 96-129.
Nazarov, D.V., et al., "Atomic layer deposition of tin dioxide nanofilms: A review", Rev. Adv. Mater. Sci. Jun. 1, 2015; 40(3):262-75.
Notice of Allowance dated Dec. 9, 2021 in U.S. Appl. No. 17/310,635.
Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).
Spitzer et al., (Mar. 1, 1986) "Conversion efficiencies from laser-produced plasmas in the extreme ultraviolet regime," J. Appl. Phys., 79(5):2251-2258.
Stowers et al.; "Directly patterned inorganic hard mask for EUV lithography"; proceedings of the SPIE 7969; Extreme Ultraviolet

(56)                References Cited

OTHER PUBLICATIONS (EUV) Lithography 11, 796915-1-11 (Apr. 7, 2011), event: SPI E Advanced Lithography, 2011, San Jose California.
Taiwanese First Office Action dated Aug. 10, 2020 issued in Application No. TW 105137362.
Taiwanese First Office Action dated May 31, 2018 issued in Application No. TW 104103153.
Taiwanese Second Office Action dated Nov. 18, 2020 issued in Application No. TW 105137362.
U.S. Final Office Action, dated May 11, 2017, issued in U.S. Appl. No. 14/610,038.
U.S. Final Office Action, dated Sep. 10, 2018, issued in U.S. Appl. No. 15/691,659.
U.S. Notice of Allowance, dated Apr. 25, 2018 issued in U.S. Appl. No. 14/948,109.
U.S. Notice of Allowance, dated Aug. 22, 2017, issued in U.S. Appl. No. 14/610,038.
U.S. Notice of Allowance, dated Jul. 28, 2020, issued in U.S. Appl. No. 16/206,959.
U.S. Notice of Allowance dated Sep. 15, 2021, issued in U.S. Appl. No. 16/691,508.
U.S. Notice of Allowance, dated Sep. 19, 2019, issued in U.S. Appl. No. 15/691,659.
U.S. Notice of Allowance dated Sep. 9, 2021, issued in U.S. Appl. No. 16/691,508.
U.S. Office Action, dated Apr. 9, 2019, issued in U.S. Appl. No. 15/691,659.
U.S. Office Action, dated Jan. 23, 2017, issued in U.S. Appl. No. 14/610,038.
U.S. Office Action, dated Mar. 5, 2020, issued in U.S. Appl. No. 16/206,959.
U.S. Office Action dated May 14, 2021, issued in U.S. Appl. No. 16/691,508.
U.S. Office Action, dated May 21, 2018, issued in U.S. Appl. No. 15/691,659.
U.S. Office Action, dated Nov. 2, 2017, issued in U.S. Appl. No. 14/948,109.
U.S. Appl. No. 17/309,247, Weidman et al., filed May 11, 2021.
U.S. Pat. Appl. No. U.S. Appl. No. 17/309,587, Volosskiy et al., filed Jun. 8, 2021.
U.S. Pat. Appl. No. U.S. Appl. No. 17/310,635, Tan et al., filed Aug. 13, 2021.
U.S. Appl. No. 17/452,365, Tan et al., filed Oct. 26, 2021.
Xu, et al., "Underlayer designs to enhance the performance of EUV resists," Proceedings of SPIE, vol. 7273, 2009, pp. 727311-1-727311-11.
International Preliminary Report on Patentability and Written Opinion dated Nov. 14, 2024 in PCT Application No. PCT/US2023/019871.
International Search Report and Written Opinion dated Aug. 28, 2024 in PCT Application No. PCT/US2024/028046.
JP Office Action dated Dec. 3, 2024 in JP Application No. 2023-558732 with English translation.
JP Office Action dated Oct. 22, 2024 in JP Application No. 2022-547251 with English translation.
KR Office Action dated Nov. 28, 2024 in KR Application No. 10-2022-7014896, with English Translation.
SG Written Opinion dated Jul. 31, 2024 in SG Application No. 11202307119P.
TW Office Action and Search Report dated Dec. 25, 2024 in TW Application No. 111112111, with English Translation.
TW Office Action dated Nov. 7, 2024 in TW Application No. 111112111, with English Translation.
TW Office Action dated Nov. 26, 2024 in TW Application No. 110126445, with English Translation.
TW Office Action dated Oct. 4, 2024 in TW Application No. 109121649 with English translation.
TW Office Action dated Sep. 25, 2024 in TW Application No. 110111136 with English translation.

U.S. Advisory Action dated Nov. 15, 2024 in U.S. Appl. No. 18/550,733.
U.S. Final Office Action dated Sep. 16, 2024 in U.S. Appl. No. 18/550,733.
U.S. Non-Final Office Action dated Sep. 17, 2024 in U.S. Appl. No. 17/995,355.
U.S. Appl. No. 18/855,026, inventors Lee Y, et al., filed Oct. 8, 2024.
EP Extended European Search report dated Apr. 15, 2025 in EP Application No. 22782195.6.
JP Office Action dated Apr. 30, 2025 in JP Application No. 2022547251, with English Translation.
JP Office Action dated Jun. 24, 2025 in JP Application No. 2022577244, with English Translation.
JP Office Action dated May 13, 2025 in JP Application No. 2023-502906, with English Translation.
KR Office Action dated Apr. 14, 2025 in KR Application No. 10-2022-7030615, with English Translation.
KR Office Action dated Jun. 12, 2025 in KR Application No. 10-2023-7001454, with English Translation.
KR Office Action dated May 29, 2025 in KR Application No. 10-2022-7038499, with English Translation.
U.S. Non-Final Office Action dated Apr. 23, 2025 in U.S. Appl. No. 18/550,733.
U.S. Non-Final Office Action dated Jun. 5, 2025 in U.S. Appl. No. 17/758,567.
U.S. Non-Final Office Action dated Jun. 18, 2025 in U.S. Appl. No. 17/753,110.
U.S. Appl. No. 19/202,425, inventors Hansen E.C et al., filed May 8, 2025.
International Search Report and Written Opinion dated Feb. 20, 2025 in PCT Application No. PCT/US2024/054806.
JP Office Action dated Feb. 18, 2025 in JP Application No. 2022-557680, with English Translation.
JP Office Action dated Mar. 4, 2025 in JP Application No. 2022-577244, with English Translation.
KR Office Action dated Mar. 13, 2025 in KR Application No. 10-2023-7004801, with English Translation.
KR Office Action dated Mar. 19, 2025 in KR Application No. 10-2022-7038020, with English Translation.
KR Office Action dated Mar. 27, 2025 in KR Application No. 10-2022-7003371, with English Translation.
TW Office Action dated Mar. 11, 2025 in TW Application No. 110126445, with English Translation.
U.S. Notice of Allowance dated Apr. 9, 2025 in U.S. Appl. No. 17/995,355.
U.S. Restriction Requirement dated Apr. 3, 2025 in U.S. Appl. No. 17/758,567.
U.S. Restriction Requirement dated Mar. 20, 2025 in U.S. Appl. No. 17/753,110.
U.S. Restriction Requirement dated Mar. 26, 2025 in U.S. Appl. No. 17/905,754.
Barret M C., et al., "Copper, Zinc and Tin Hydroxypyridinones," Transition Metal Chemistry, Jan. 2015, vol. 40, pp. 241-254.
Cilibrizzi A., et al., "Hydroxypyridinone Journey into Metal Chelation," Chemical Review, Jul. 2018, vol. 118, pp. 7657-7701.
Fitzgerald A., et al., "Determination of Trace Metals in Positive Photoresist," Journal of the Electrochemical Society, May 1992, vol. 139 (5), pp. 1413-1414.
JP Office Action dated Aug. 19, 2025 in JP Application No. 2022-557680, with English Translation.
JP Office Action dated Oct. 7, 2025 in JP Application No. 2024-197800, with English Translation.
JP Office Action dated Sep. 9, 2025 in JP Application No. 2023-502906, with English Translation.
KR Office Action dated Aug. 27, 2025 in KR Application No. 10-2022-7014896, with English Translation.
TW Office Action and Search Report dated Aug. 4, 2025 in TW Application No. 114105681, with English Translation.
TW Office Action and Search Report dated Aug. 15, 2025 in TW Application No. 114123201, with English Translation.
TW Office Action and Search Report dated Oct. 30, 2025 in TW Application No. 111127705, with English Translation.

(56)         References Cited

OTHER PUBLICATIONS

U.S. Final Office Action dated Aug. 11, 2025 in U.S. Appl. No. 18/550,733.
U.S. Non-Final Office Action dated Jul. 8, 2025 in U.S. Appl. No. 17/998,354.
U.S. Non-Final Office Action dated Jul. 14, 2025 in U.S. Appl. No. 18/005,571.
U.S. Non-Final Office Action dated Jul. 16, 2025 in U.S. Appl. No. 17/905,754.
Waard H D., et al., "Observations on Implanted Xenon-133 Sources," Proceedings of the Royal Society of London. Series A, Mathematical and Physical Sciences, Jun. 1969, vol. 311 (1504), pp. 139-150.
KR Office Action dated Dec. 28, 2025 in KR Application No. 10-2022-7003371, with English Translation.
KR Notice of Allowance and Search Report dated Feb. 18, 2026 in KR Application No. 10-2022-7038499, with English translation.
KR Office Action dated Feb. 11, 2026 in KR Application No. 10-2025-7015615, with English Translation.
TW Office Action dated Feb. 24, 2026 in TW Application No. 114123201, with English Translation.
U.S. Advisory Action dated Jan. 16, 2026 in U.S. Appl. No. 17/753,110.
U.S. Final Office Action dated Dec. 12, 2025 in U.S. Appl. No. 17/758,567.
U.S. Final Office Action dated Feb. 18, 2026 in U.S. Appl. No. 17/905,754.
U.S. Non-Final Office Action dated Dec. 18, 2025 in U.S. Appl. No. 18/580,334.
U.S. Non-Final Office Action dated Jan. 28, 2026 in U.S. Appl. No. 18/550,733.
U.S. Notice of Allowance dated Dec. 11, 2025 in U.S. Appl. No. 17/998,354.

* cited by examiner

Deposit metal oxide based extreme ultraviolet (EUV) photoresist on substrate    101

Expose substrate to post-application bake (PAB)    103

Expose substrate to EUV radiation to pattern metal oxide based EUV photoresist    105

Expose substrate to post-exposure bake (PEB)    107

Develop metal oxide based EUV photoresist    109

BAKE STRATEGIES TO ENHANCE LITHOGRAPHIC PERFORMANCE OF METAL-CONTAINING RESIST

INCORPORATION BY REFERENCE

A PCT Request Form is filed concurrently with this specification as part of the present application. Each application that the present application claims benefit of or priority to as identified in the concurrently filed PCT Request Form is incorporated by reference herein in their entireties and for all purposes.

FIELD

This disclosure relates generally to the field of semiconductor processing. In particular aspects, the disclosure is directed to process and apparatus for processing of photoresists in the context of lithographic patterning and film development to form a patterning mask.

BACKGROUND

As semiconductor fabrication continues to advance, feature sizes continue to shrink and new processing methods are needed. One area where advances are being made is in the context of patterning, for example using photoresist materials that are patterned through exposure to radiation.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Various embodiments herein relate to methods, apparatus, and systems for baking a photoresist layer on a substrate. In one aspect of the disclosed embodiments, a method of baking a photoresist layer on a substrate is provided, the method including: receiving the substrate in a process chamber, the substrate including the photoresist layer thereon, where the photoresist layer includes a metal-containing photoresist material; flowing a reactive gas species from a gas source, through a gas delivery line, into the process chamber, and exposing the substrate to the reactive gas species in the process chamber; and baking the photoresist layer while the substrate is exposed to the reactive gas species.

In various embodiments, the photoresist layer includes an extreme ultraviolet (EUV) photoresist material. In some embodiments, the reactive gas species includes a gas selected from the group consisting of: water, hydrogen, oxygen, ozone, hydrogen peroxide, carbon monoxide, carbon dioxide, ammonia, nitrous oxide, nitric oxide, an alcohol, acetyl acetone, formic acid, oxalyl chloride, pyridine, a carboxylic acid, an amine, and combinations thereof. In some cases, the reactive gas species may include the water. In these or other cases, the reactive gas species may include the hydrogen. In these or other cases, the reactive gas species may include the oxygen. In these or other cases, the reactive gas species may include the ozone. In these or other cases, the reactive gas species may include the hydrogen peroxide. In these or other cases, the reactive gas species may include the carbon monoxide. In these or other cases, the reactive gas species may include the carbon dioxide. In these or other cases, the reactive gas species may include the ammonia. In some such cases, baking the photoresist occurs after the photoresist has been exposed to EUV radiation to pattern the photoresist, and one of the following conditions is satisfied: (i) the process chamber is maintained at atmospheric pressure while baking the photoresist, and the ammonia is provided at a concentration between about 0.001-5% (by volume), or (ii) the process chamber is maintained at sub-atmospheric pressure while baking the photoresist, and the ammonia is provided at a partial pressure between about 1-100 mTorr. In these or other cases, the reactive gas species may include the nitrous oxide and/or the nitric oxide. In these or other cases, the reactive gas species may include the alcohol. In these or other cases, the reactive gas species may include the acetyl acetone. In these or other cases, the reactive gas species may include the formic acid. In these or other cases, the reactive gas species may include the oxalyl chloride. In these or other cases, the reactive gas species may include the carboxylic acid. In these or other cases, the reactive gas species may include the amine Example amines may include methylamine, dimethylamine, trimethylamine, ethylamine, diethylamine, and/or triethylamine in certain cases. In various embodiments, the reactive gas species may be oxidative. In these or other cases, the reactive gas species may be polar.

In certain implementations, exposing the substrate to the reactive gas species may promote cross-linking within the photoresist layer. In these or other embodiments, exposing the substrate to the reactive gas species may promote removal of low molecular weight species in the photoresist layer. For example, the low molecular weight species may include zero, one, or two metal atoms per molecule. In some embodiments, exposing the substrate to the reactive gas species may oxidize a metal hydride species in the photoresist layer to a metal hydroxide species.

In certain implementations, the method may further include applying vacuum to the process chamber while baking the photoresist layer. In these or other embodiments, the method may further include controlling a concentration of water in the process chamber such that it remains within a target water concentration range while baking the photoresist layer. Similarly, the method may include controlling a concentration of oxygen in the process chamber such that it remains within a target oxygen concentration range while baking the photoresist layer. In some embodiments, the process chamber may be maintained at or below atmospheric pressure while baking the photoresist layer. For example, in some cases the process chamber may be maintained below atmospheric pressure while baking the photoresist layer.

A support on which the substrate is positioned may be temperature controlled while baking the photoresist layer. For instance, in some embodiments the method may further include increasing a temperature of the substrate support on which the substrate is positioned while baking the photoresist layer. In these or other embodiments, the method may further include decreasing a temperature of the substrate support on which the substrate is positioned while baking the photoresist layer. In some cases, the method may include controlling a flow of the reactive species into the process chamber to achieve a target degree of crosslinking. Various different types of heat may be provided. In some embodiments, baking the photoresist layer includes heating the substrate on a hot plate. In some embodiments, baking the photoresist layer includes exposing the substrate to infrared radiation and/or ultraviolet radiation. In some embodiments, baking the photoresist layer may include heating the substrate from above. In these or other embodiments, baking the photoresist layer may include heating the substrate from below.

The methods described herein may be used for different applications. In some cases, the photoresist layer has been applied to the substrate but not yet patterned, and the baking is a post-application bake (PAB). In other cases, the photoresist layer has been applied to the substrate and patterned by partial exposure to EUV radiation resulting in exposed and unexposed portions of the photoresist layer, and the baking is a post-exposure bake (PEB). In these or other embodiments, the reactive gas species may include polar and oxidative molecules. For instance, the reactive gas species may include hydrogen peroxide.

In another aspect of the disclosed embodiments, an apparatus for baking a photoresist layer on a substrate is provided, the apparatus including: a process chamber; an inlet for introducing a reactive gas species to the process chamber; an outlet for removing materials from the process chamber; a substrate support in the process chamber; a heater configured to heat the substrate through conduction, convection, and/or radiation; and a controller having at least one processor, where the at least one processor is configured to control the apparatus to cause any of the methods claimed or otherwise described herein.

These and other aspects are described further below with reference to the drawings.

DETAILED DESCRIPTION

Figure 1:
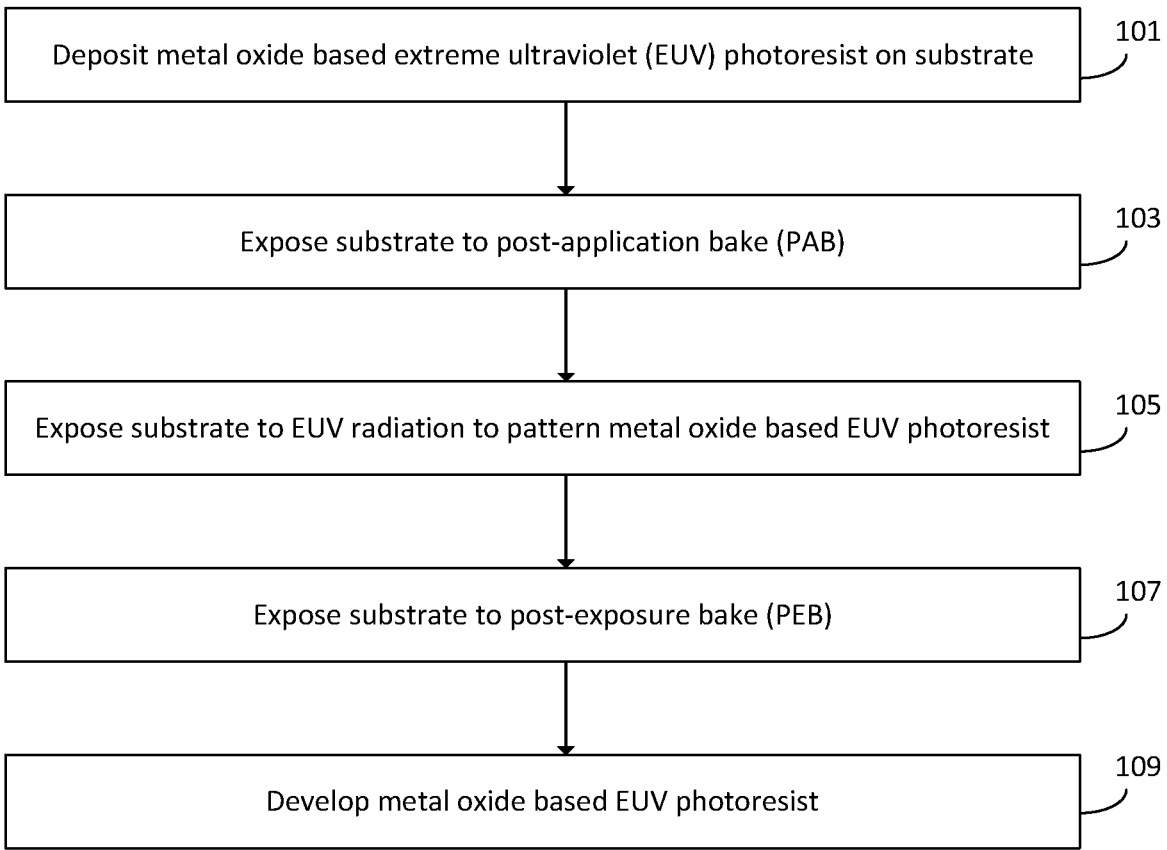
FIG. 1 presents a flow chart describing a lithographic patterning process according to various embodiments.

Reference is made herein in detail to specific embodiments of the disclosure. Examples of the specific embodiments are illustrated in the accompanying drawings. While the disclosure will be described in conjunction with these specific embodiments, it will be understood that it is not intended to limit the disclosure to such specific embodiments. On the contrary, it is intended to cover alternatives, modifications, and equivalents as may be included within the spirit and scope of the disclosure. In the following description, numerous specific details are set forth in order to provide a thorough understanding of the present disclosure. The present disclosure may be practiced without some or all of these specific details. In other instances, well known process operations have not been described in detail so as to not unnecessarily obscure the present disclosure.

Patterning of thin films in semiconductor processing is often an important step in the fabrication of semiconductors. Patterning involves lithography. In conventional photolithography, such as 193 nm photolithography, patterns are printed onto a photosensitive photoresist film by exposing the photoresist to photons in selective areas defined by a photomask, and thereby causing a chemical reaction in the photoresist and creating chemical contrast that can be leveraged in the development step to remove certain portions of the photoresist to form the pattern. The patterned and developed photoresist film then can be used as an etch mask to transfer the pattern into the underlying films that are composed of metal, oxide, etc.

Advanced technology nodes (as defined by the International Technology Roadmap for Semiconductors) including nodes 22 nm, 16 nm, and beyond, require continuous improvement in lithography resolution. In the 16 nm node, for example, the width of a via or line in a Damascene structure is typically no greater than about 30 nm, which is not possible with simple 193 nm photolithography, or otherwise involves complex multi-patterning schemes.

Extreme ultraviolet (EUV) lithography can extend lithography technology by moving to smaller imaging source wavelengths than would be achievable with conventional photolithography methods. EUV light sources at approximately 10-20 nm, or 11-14 nm wavelength, for example 13.5 nm wavelength, can be used for leading-edge lithography tools, also referred to as scanners. The EUV radiation is strongly absorbed in a wide range of solid and fluid materials including quartz and water vapor, as well as ambient-pressure gases, and so EUV scanners operate in a vacuum.

EUV lithography makes use of EUV resists that are patternable using EUV light to form masks for use in etching underlying layers. EUV resists may be polymer-based chemically amplified resists (CARs) produced by liquid-based spin-on techniques. An alternative to CARs are directly photopatternable metal-oxide based EUV photoresist (PR) films. Such PR films may be produced by (wet) spin-on techniques, such as those available from Inpria, Corvallis, Oreg., and as described, for example, in US Patent Publications US 2017/0102612 and US 2016/0116839, incorporated by reference herein at least for their disclosure of photopatternable metal oxide-containing films, or dry vapor-deposited as described in Application PCT/US19/31618, filed May 9, 2019, and titled METHODS FOR MAKING EUV PATTERNABLE HARD MASKS, the disclosures of which at least relating to the composition and patterning of directly photopatternable metal oxide films to form EUV resist masks is incorporated by reference herein. These directly photopatternable EUV resists may be composed of or contain high-EUV-absorbance metals and their organometallic oxides/hydroxides and other derivatives. Upon EUV exposure, EUV photons as well as secondary electrons generated can induce chemical reactions, such as beta-H elimination reaction in SnOx-based resist (and other metal oxide based resists), and provide chemical functionality to facilitate cross-linking and other changes in the resist film. These chemical changes can then be leveraged in the development step to selectively remove the exposed or unexposed area of the resist film and to create an etch mask for pattern transfer.

It should also be understood that the while present disclosure relates to lithographic patterning techniques and materials exemplified by EUV lithography, it is also applicable to other next generation lithographic techniques. In addition to EUV, which includes the standard 13.5 nm EUV wavelength currently in use and development, the radiation sources most relevant to such lithography are DUV (deep-UV), which generally refers to use of 248 nm or 193 nm excimer laser sources, X-ray, which formally includes EUV at the lower energy range of the X-ray range, as well as e-beam, which can cover a wide energy range. The specific methods may depend on the particular materials and applications used in the semiconductor substrate and ultimate semiconducting device. Thus, the methods described in this application are merely exemplary of the methods and materials that may be used in present technology.

Photolithography processes typically involve one or more bake steps to facilitate the chemical reactions required to produce chemical contrast between exposed and unexposed areas of the photoresist. For high volume manufacturing (HVM), such bake steps are typically performed on tracks where the wafers are baked on a hot-plate at a pre-set temperature under ambient-air or in some cases $N_2$ flow. More careful control of the bake ambient as well as introduction of an additional reactive gas component in the ambient during these bake steps can help further reduce the dose requirement and/or improve pattern fidelity.

This disclosure describes a new bake strategy that involves careful control of the bake ambient, introduction of reactive gases, and in some cases careful control of the ramping rate of the bake temperature. Such a strategy can be particularly useful for metal oxide based EUV photoresist (PR). Examples of useful reactive gases include water, hydrogen, oxygen, ozone, hydrogen peroxide, carbon monoxide, carbon dioxide, ammonia, nitrous oxide, nitric oxide, methylamine, dimethylamine, alcohols, acetyl acetone, formic acid, oxalyl chloride, carboxylic acids, other amines, substituted forms of any of these materials, etc. The reactive gas is provided in gaseous form, and may be vaporized before delivery to the reaction chamber. Various example gases are further discussed below.

While this disclosure is not limited to any particular theory or mechanism of operation, it is understood that these reactive gas molecules can potentially accelerate cross-linking behavior of the metal oxide based EUV photoresist in the EUV exposed area (the area that remains to form the mask following development of the patterned film in this example) via oxidation, coordination, or acid/base chemistry, while having limited impact on the cross-linking in the unexposed area. Alternatively or in addition, in some cases, the reactive gas molecules may promote removal of volatile species from the metal oxide based EUV photoresist, thereby further increasing the stability of the resist.

FIG. 1 presents a flow chart according to various embodiments. At operation 101, resist is deposited on the substrate. The substrate on which the resist is deposited typically includes underlying materials that will eventually be etched after the resist is patterned/developed. In various embodiments, the substrate on which the resist is deposited may have an exposed layer of amorphous carbon, spin-on-carbon (SoC), spin-on glass (SoG), silicon oxide, silicon nitride, silicon oxynitride, silicon carbide, silicon oxycarbide, etc. In many cases the exposed layer is an ashable hardmask (AHM). The resist that is deposited in operation 101 is a metal oxide based EUV photoresist. The deposition may occur through wet spin-on techniques or dry vapor-based techniques such as chemical vapor deposition (CVD) and/or atomic layer deposition (ALD), either of which may be driven by thermal energy, plasma energy, or both. Next, at operation 103, the substrate is exposed to heat in a first bake step often referred to as the post-application bake (PAB). At operation 105, the substrate is exposed to EUV radiation to pattern the resist, thereby forming exposed areas and unexposed areas of the resist. Next, at operation 107, the substrate is exposed to heat in a second bake step often referred to as the post-exposure bake (PEB). Then, at operation 109, the resist is developed to selectively remove the unexposed areas. In various embodiments herein, the atmosphere to which the substrate is exposed may be controlled during the PAB of operation 103 and/or during the PEB of operation 107. For instance, the substrate may be exposed to one or more reactive gases during these steps. Each of the bake steps are further discussed below.

1. Post-Application Bake (PAB)

The post-application bake is performed after the resist is deposited on the substrate, and before the resist is exposed to EUV radiation for patterning. See operation 103 of FIG. 1. The PAB may be performed to drive off excess solvent (e.g., in cases where the resist is deposited through spin-on methods), drive off other low molecular weight or otherwise volatile species, and promote a desired degree of cross-linking within the resist. These features operate to increase the stability of the resist. For example, by driving off low molecular weight or otherwise volatile species that are unbound or only loosely bound within the resist, the outgassing of metal-containing molecules can be reduced to an acceptable amount (e.g., <1E10 molecules/(cm$^2$*month)). It is advantageous to remove these materials because they could otherwise contaminate downstream processes, equipment, and substrates. The cross-linking achieved during PAB likewise increases the stability of the resist; however, too much cross-linking can lead to increases in line width roughness. As such, cross-linking may be controlled to a desired degree during the PAB.

In various embodiments herein, the substrate may be exposed to a reactive gas during the PAB. The reactive gas may promote removal of low molecular weight or otherwise volatile species. In various embodiments, the low molecular weight species that are removed during the PAB may have zero metal atoms, 1 metal atom, or 2 metal atoms. In some cases, the low molecular weight species that are removed may include dimetal species. Molecules having three or more metal atoms typically have a relatively higher molecular weight and are relatively less volatile, and may substantially remain in the resist during the PAB. In addition to removing low molecular weight species, the reactive gas may promote a desired degree of cross-linking within the resist. As a result of these features, the use of reactive gas during the PAB may help stabilize the resist.

Example processing apparatus and reactive gases are provided below. The substrate may be exposed to any one or more of these reactive gases during the PAB in various embodiments. In a particular example, the substrate may be exposed to a processing atmosphere having a controlled amount of oxygen and/or moisture (e.g., water vapor) along with inert gas during the PAB. In some embodiments, appropriate gas sensors and feedback mechanisms may be used to ensure that the composition of the processing atmosphere is controlled within desired ranges.

In various embodiments, one or more processing condition may be controlled as follows during the PAB. The substrate may be heated to an elevated temperature between about 100-170° C., for example between about 100-130° C. in some cases. The pressure may be maintained between about 0.1-760 Torr, for example between about 0.1-1 Torr in some cases. The substrate may be exposed to the elevated temperature for a duration between about 1-10 minutes, for example between about 2-5 minutes. Inert gases may be flowed into the processing chamber at a rate between about 10-10,000 sccm. In a particular example, the concentration of oxygen (e.g., $O_2$) in the processing chamber may be controlled during the PAB. In these or other embodiments, the concentration of water (e.g., $H_2O$ vapor) may be controlled during the PAB.

In some embodiments the PAB may be omitted. The PAB may not be needed in cases where the resist is deposited through dry vapor-based techniques, rather than wet spin-on techniques, for example because there is no need to remove excess solvent used to deposit the resist. However, even where the resist is deposited through dry vapor-based techniques, it can be advantageous to perform a PAB to promote a desired degree of crosslinking and to remove low molecular weight or otherwise non-volatile species, which may be a larger concern with dry vapor based deposition techniques than with wet spin-on deposition techniques. In some embodiments, the PAB may be a conventional PAB. In other words, the PAB may occur without exposing the substrate to a reactive gas species and/or in a non-controlled atmosphere. In such embodiments, the substrate may be exposed to a reactive gas species during the post-exposure bake, as discussed further below.

2. Post-Exposure Bake (PEB)

The post-exposure bake is performed after the resist is exposed to EUV radiation for patterning, and before the resist is developed to remove unexposed portions of the resist. See operation 107 of FIG. 1. The PEB may be performed for several purposes, for example: 1) to drive complete evaporation of the organic fragments that are generated during EUV exposure; 2) to oxidize the metal hydride species (the other product from the beta-H elimination reaction during EUV exposure) into metal hydroxide; and 3) to facilitate the cross-linking between neighboring —OH groups and form a cross-linked metal oxide network.

The bake temperature is carefully selected to achieve optimal EUV lithographic performance Too low a PEB temperature would lead to incomplete removal of organic fragments as well as insufficient cross-linking, and consequently less chemical contrast for development at a given dose. Too high a PEB temperature would also have detrimental impacts, including severe oxidation and film shrinkage in the unexposed area (the area that is removed by development of the patterned film to form the mask in this example), as well as, undesired interdiffusion at the interface between PR and underlayer (UL; typically a spin-on carbon material), both of which will contribute to loss of chemical contrasts and an increase in defect density due to insoluble scum. Having the bake temperature and bake time as the only knobs, the tunability and process window is often very limited.

Careful control on the bake ambient and introduction of reactive gas species during the PEB process, as described herein, provides an additional chemistry knob to fine-tune the cross-linking process. For example, having polar and oxidative molecules like $H_2O_2$ present during the bake step can facilitate the oxidation of the metal hydride in the exposed area, because the exposed area tends to be more polar than unexposed area due to the loss of alkyl groups and formation of hydride/hydroxide components. Other gases such as those described below in the Reactive Gases section may also change the kinetics of hydride oxidation and hydroxide cross-linking reaction via oxidation, acid/base chemistry, coordination chemistry, and the combination of them. The reactive gas(es) may be provided in a controlled atmosphere, for example using any of the apparatus described in the Bake Apparatus section below. The reactive gases may be provided along with non-reactive gases such as Na, Ar, He, Ne, Kr, Xe, etc. In some cases, air or clean dry air may be provided in the atmosphere during the PEB.

The ability to tune the kinetics of cross-linking behavior in metal oxide based EUV photoresist materials provides a wider process window that allows for further optimization of lithographic performance by minimizing interdiffusion and other relevant defect formation mechanisms. For instance, if reactive gases can effectively bring down the bake temperature requirement, then the interdiffusion concerns at the PR/UL interface can be alleviated, which will be beneficial for defect reduction.

In certain embodiments, one or more processing condition may be controlled as follows during the PEB. The substrate may be heated to an elevated temperature between about 100-250° C., for example between about 120-200° C. in some cases. The pressure may be maintained between about 0.1-760 Torr, for example between about 0.1-1 Torr in some cases. The substrate may be exposed to the elevated temperature for a duration between about 1-10 minutes, for example between about 2-5 minutes. Inert gases may be flowed into the processing chamber at a rate between about 10-10,000 sccm. In a particular example, the concentration of oxygen (e.g., $O_2$) in the processing chamber may be controlled during the PEB. In these or other embodiments, the concentration of water (e.g., $H_2O$ vapor) may be controlled during the PEB.

In a particular embodiment, the substrate may be exposed to ammonia during the PEB. In some cases, ammonia may be the only reactive gas present during the PEB, while in other cases one or more additional reactive gas may be provided along with the ammonia. In some embodiments, the ammonia may be provided at a concentration between about 0.001-5.0% (by volume), in some cases between about 0.001-0.5% (by volume) at atmospheric pressure, or at a partial pressure between about 1-100 mTorr, in some cases between about 1-10 mTorr when the process chamber is under vacuum. The duration of the PEB (and/or the duration of substrate exposure to ammonia during the PEB) may be between about 5 seconds and about 10 minutes, in some cases between about 5 seconds and 1 minute. After the substrate is exposed to the ammonia, the process chamber may be purged with inert gas. In various embodiments, the duration of the inert gas purge may be as long or longer than the duration over which the substrate is exposed to ammonia. These steps may promote the alkaline catalysis of M-OH condensation/cross-linking, which causes formation of relatively higher molecular weight, less volatile species, resulting in a more stable photoresist film, as discussed above. These steps may also harden and densify areas of the film that have been exposed to EUV radiation (or other types of lithographic patterning radiation), and may enable these effects at lower bake temperatures than would otherwise be required to achieve the same film properties. In some embodiments, these same reaction conditions may be used during a PAB. In some cases, these same reaction conditions may be used during PAB and/or PEB with an alternative or additional reactive gas described herein, including but not limited to other volatile amines such as methylamine, dimethylamine, trimethylamine, ethylamine, diethylamine, triethylamine, pyridine, etc.

In some embodiments, the PEB may be a conventional PEB. In other words, the PEB may be performed without providing any reactive gases to the substrate and/or in a non-controlled atmosphere. In such cases, one or more reactive gas may be provided to the substrate during the PAB.

3. Reactive Gases

In various embodiments herein, a substrate may be exposed to one or more reactive gases during a photoresist bake operation. The reactive gas may promote a desired degree of cross-linking, promote removal of low molecular weight or otherwise volatile species, and/or stabilize the photoresist, as described above.

A number of different reactive gases may be used. Examples of useful reactive gases include water ($H_2O$), hydrogen ($H_2$), oxygen ($O_2$), ozone ($O_3$), hydrogen peroxide ($H_2O_2$), carbon monoxide (CO), carbon dioxide ($CO_2$), ammonia ($NH_3$), nitrous oxide ($N_2O$), nitric oxide (NO), methylamine ($CH_3NH_2$), dimethylamine (($CH_3)_2NH$), trimethylamine ($N(CH_3)_3$), ethylamine ($CH_3CH_2NH_2$), diethylamine (($CH_3CH_2)_2NH$), triethylamine ($N(CH_2CH_3)_3$), alcohols ($C_nH_{2n+1}OH$, including but not limited to methanol, ethanol, propanol, and butanol), acetyl acetone ($CH_3COCH_2COCH_3$), formic acid (HCOOH), oxalyl chloride (($COCl)_2$), carboxylic acids ($C_nH_{2n+1}COOH$), and other small molecule amines ($NR^1R^2R^3$, where each of $R^1$, $R^2$, and $R^3$ is independently selected from hydrogen, hydroxyl, aliphatic, haloaliphatic, haloheteroaliphatic, heteroaliphatic, aromatic, aliphatic-aromatic, heteroaliphatic-aromatic, or any combinations thereof), etc. Substituted forms of these reactive gases may also be used. In some cases, the substrate may be exposed to two or more reactive gases during a photoresist bake operation.

The reactive gas may interact with the photoresist via oxidation, coordination, or acid/base chemistry. In some cases where the reactive gas is delivered during a PEB operation, the reactive gas may preferentially interact with the photoresist in areas that were exposed to EUV radiation. This preferential interaction may arise due to the chemical changes that occur during EUV exposure, for example the loss of alkyl groups within the photoresist.

Following exposure of the substrate to reactive gas during PAB and/or PEB, the chamber in which the substrate is processed may be evacuated and/or purged, for example with inert gas. In some cases, the duration of the inert gas purge may be at least as long as the duration over which the substrate is exposed to the reactive gas.

4. Temperature Ramping

In some embodiments, the rate at which the substrate temperature changes may be controlled during a bake step. Rapid heating and cooling can be problematic in some cases. By controlling the rate at which the substrate temperature increases or decreases, the problems associated with rapid heating and cooling can be avoided. Further, the rate at which the bake temperature is ramped up and/or down may be controlled to fine tune the cross-linking behavior in the resist.

5. Bake Apparatus

The bake operations described herein may occur on various different types of processing apparatus. In some cases, the processing apparatus may have a closed chamber that is sealed from the ambient environment. In other cases, the processing apparatus may have an open chamber that is not sealed from the ambient. In certain cases where an open chamber is used, the substrates may be processed on a track, which may operate continuously or non-continuously. Generally, closed chambers provide better control over the processing atmosphere, and provide additional safety with respect to potentially hazardous reactive chemicals. However, open chambers may be preferred in some cases, for example where high volume manufacturing and non-hazardous chemistry are used.

The chamber may be equipped with one or more inlets for providing a desired processing atmosphere. The desired processing atmosphere may include one or more reactive gas as described above. As such, the inlet may be fluidically connected with a reactive gas source. The reactive gas may flow from the reactive gas source, through a gas delivery line, through the inlet, and into the chamber. In cases where the reactive gas is liquid at relevant temperatures, it may be stored as liquid and then vaporized before delivery to the gas delivery line/inlet/chamber. In addition, air and/or inert gas (e.g., $N_2$, Ar, He, Ne, Kr, Xe, etc.) may be provided to the processing atmosphere in certain implementations. These may likewise flow from a gas source, through a gas delivery line, through an inlet, and into the chamber. In some cases, the processing atmosphere may be air-free.

The chamber may also be equipped with one or more outlets for removing materials from the chamber. The outlet may be fluidically connected with a vacuum source to allow for active removal of gaseous species from the chamber. Vacuum-connected outlets may be used in both closed chambers and open chambers. When used in a closed chamber, a vacuum-connected outlet may enable processing at sub-atmospheric pressures. In cases where the processing chamber is an open chamber that is not sealed from the ambient, the outlet may be any path through which gas can passively escape from the chamber.

As mentioned above, in certain embodiments the atmosphere within the chamber may be controlled during a bake step. In some cases, a concentration of a reactive gas (e.g., oxygen and/or water and/or any of the other reactive gases described herein) may be actively controlled during a bake step. In addition to the inlets and outlets mentioned above, the chamber may be further equipped with sensors (e.g., a residual gas analyzer, a Fourier-transform infrared spectroscopy sensor, etc.) to monitor the composition of the atmosphere in the chamber. These sensors may be used to provide feedback for actively controlling the composition of the bake atmosphere.

In order to bake the photoresist, the chamber is equipped with one or more heating element configured to heat the substrate. The heating element(s) may heat the substrate from above and/or from below. The heating element(s) may heat the front side of the substrate (e.g., where semiconductor devices/structures are being formed) and/or the back side of the substrate. Various different types of heating elements may be used, either alone or in combination with one another. Example heating elements may include heated substrate supports (e.g., pedestals, chucks, etc.) and radiation sources such as infrared lamps and/or ultraviolet lamps.

In some embodiments, the chamber may be equipped with one or more cooling element configured to cool the substrate. For example, the substrate support may be configured to cool the substrate. In one embodiment, the substrate support may include cooling channels through which a heat exchange fluid flows to thereby cool the substrate. Other heat exchange hardware may be used as desired for a particular application. The cooling element may be particularly useful for controlling the rate at which the substrate cools after a baking operation.

The chamber may also be equipped with temperature sensors for monitoring the temperature of the substrate and/or substrate support during a baking operation. In one example, the chamber includes a pyrometer for measuring the temperature of the substrate surface during baking. Temperature measurements from the pyrometer or other temperature sensor may be used as feedback to actively control the temperature of the substrate during baking.

Figure 2:
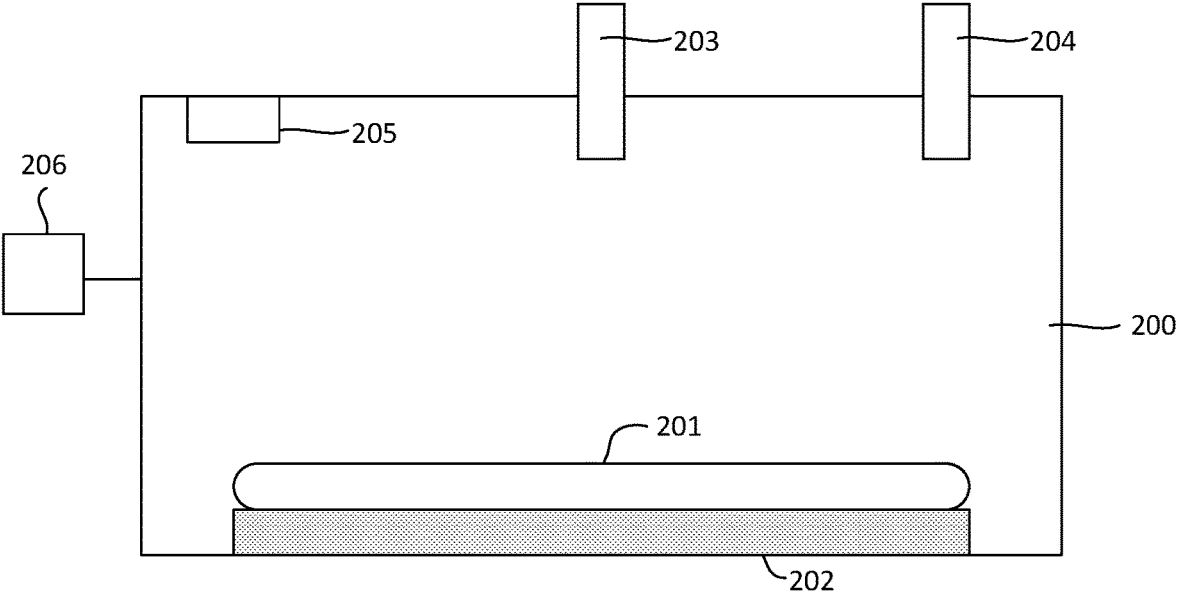
FIG. 2 presents a simplified view of a processing chamber according to certain embodiments.

FIG. 2 presents a simplified view of a processing chamber 200 according to one embodiment. In this example, the processing chamber 200 is a closed chamber having a controllable atmosphere. The substrate 201 may be positioned on substrate support 202, which may also heat and/or cool the substrate. Alternative or additional heating and cooling elements may be provided in some cases. Processing gases enter the processing chamber 200 through inlet 203. Materials are removed from the processing chamber 200 through outlet 204, which may be connected to a vacuum source (not shown). Operation of the processing chamber 200 may be controlled by a controller 206, which is further discussed below. Further, a sensor 205 may be provided, for example to monitor temperature and/or the composition of the atmosphere in the processing chamber 200. Readings from sensor 205 may be used by controller 206 in an active feedback loop.

The chamber in which baking takes place may be configured in a number of ways. In some embodiments, the chamber is the same chamber used to deposit the photoresist, and/or the same chamber used to expose the photoresist to EUV radiation, and/or the same chamber used to develop the photoresist. In some embodiments, the chamber is a dedicated bake chamber that is not used for other processes such as deposition, etching, EUV exposure, or photoresist development. The chamber may be a standalone chamber, or it may be integrated into a larger processing tool such as the deposition tool used to deposit the photoresist, the EUV exposure tool used to expose the photoresist to EUV radiation, and/or the development tool used to develop the photoresist. The chamber used for baking may be combined with any one or more of these tools, as desired for a particular application.

The chamber may also be equipped with a controller. In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

CONCLUSION

Bake strategies to enhance EUV-lithographic performance of metal-containing EUV resist are disclosed.

It is understood that the examples and embodiments described herein are for illustrative purposes only and that various modifications or changes in light thereof will be suggested to persons skilled in the art. Although various details have been omitted for clarity's sake, various design alternatives may be implemented. Therefore, the present examples are to be considered as illustrative and not restrictive, and the disclosure is not to be limited to the details given herein, but may be modified within the scope of the disclosure.

What is claimed is:

1. A method of baking a photoresist layer on a substrate, the method comprising:
  receiving the substrate in a process chamber, the substrate comprising the photoresist layer thereon after completion of deposition of the photoresist layer, wherein the photoresist layer comprises a metal-containing photoresist material;
  flowing two or more reactive gas species from one or more gas sources, through one or more gas delivery lines, into the process chamber, and exposing the substrate to the two or more reactive gas species in the process chamber after the completion of the deposition of the photoresist layer; and
  baking the photoresist layer, after the completion of the deposition of the photoresist layer, while the substrate is exposed to the two or more reactive gas species, wherein each of the two or more reactive gas species is selected from the group consisting of: water, hydrogen, hydrogen peroxide, carbon monoxide, carbon dioxide, ammonia, nitrous oxide, nitric oxide, acetyl acetone, formic acid, oxalyl chloride, pyridine, a carboxylic acid, and an amine.

2. The method of claim 1, wherein the photoresist layer comprises an extreme ultraviolet (EUV) photoresist material.

3. The method of claim 1, wherein one of the two or more reactive gas species is water.

4. The method of claim 1, wherein one of the two or more reactive gas species is ammonia.

5. The method of claim 4, wherein baking the photoresist occurs after the photoresist has been exposed to EUV radiation to pattern the photoresist, and wherein one of the following conditions is satisfied:
  (i) the process chamber is maintained at atmospheric pressure while baking the photoresist, and the ammonia is provided at a concentration between about 0.001-5% (by volume), or (ii) the process chamber is maintained at sub-atmospheric pressure while baking the photoresist, and the ammonia is provided at a partial pressure between about 1-100 mTorr.

6. The method of claim 1, wherein one of the two or more reactive gas species is nitrous oxide or nitric oxide.

7. The method of claim 1, wherein one of the two or more reactive gas species is amine.

8. The method of claim 7, wherein the amine comprises methylamine, dimethylamine, and/or trimethylamine.

9. The method of claim 7, wherein the amine comprises ethylamine, diethylamine, and/or triethylamine.

10. The method of claim 1, wherein one of the two or more reactive gas species is oxidative.

11. The method of claim 1, wherein one of the two or more reactive gas species is polar.

12. The method of claim 1, wherein exposing the substrate to the two or more reactive gas species promotes cross-linking within the photoresist layer.

13. The method of claim 1, wherein exposing the substrate to the two or more reactive gas species increases a stability of the photoresist layer.

14. The method of claim 1, wherein exposing the substrate to the two or more reactive gas species promotes removal of low molecular weight species in the photoresist layer.

15. The method of claim 1, further comprising controlling a concentration of water in the process chamber such that it remains within a target water concentration range while baking the photoresist layer.

16. The method of claim 1, further comprising controlling a concentration of oxygen in the process chamber such that it remains within a target oxygen concentration range while baking the photoresist layer.

17. The method of claim 1, wherein the process chamber is maintained at or below atmospheric pressure while baking the photoresist layer.

18. The method of claim 1, wherein the photoresist layer has been applied to the substrate but not yet patterned, and the baking is a post-application bake (PAB).

19. The method of claim 1, wherein the photoresist layer has been applied to the substrate and patterned by partial exposure to EUV radiation resulting in exposed and unexposed portions of the photoresist layer, and the baking is a post-exposure bake (PEB).

* * * * *